(12) United States Patent
Rutherford

(10) Patent No.: US 6,263,158 B1
(45) Date of Patent: Jul. 17, 2001

(54) FIBROUS SUPPORTED POLYMER ENCAPSULATED ELECTRICAL COMPONENT

(75) Inventor: James M. Rutherford, Dresbach, MN (US)

(73) Assignee: Watlow Polymer Technologies, Winona, MN (US)

( * ) Notice: Subject to any disclaimer, the term of this patent is extended or adjusted under 35 U.S.C. 154(b) by 0 days.

(21) Appl. No.: 09/309,429

(22) Filed: May 11, 1999

(51) Int. Cl.[7] .................................. H05B 3/40; H05B 3/44

(52) U.S. Cl. ............................................ 392/503; 219/544

(58) Field of Search .................................. 219/544, 546, 219/548, 549; 392/432, 434, 503; 29/611

(56) References Cited

U.S. PATENT DOCUMENTS

| D. 224,406 | 7/1972 | Heck | D26/1 |
|---|---|---|---|
| 1,043,922 | 11/1912 | Gold | 219/523 |
| 1,046,465 | 12/1912 | Hoyt . | |
| 1,281,157 | 10/1918 | Hadaway, Jr. . | |
| 1,477,602 | 12/1923 | Simon . | |
| 1,674,488 | 6/1928 | Tang . | |
| 1,987,119 | 1/1935 | Long | 219/39 |
| 1,992,593 | 2/1935 | Whitney | 219/46 |
| 2,146,402 | 2/1939 | Morgan | 219/523 |
| 2,274,445 | 2/1942 | Greer | 219/38 |
| 2,426,976 | 9/1947 | Taulman | 219/19 |
| 2,456,343 | 12/1948 | Tuttle | 201/67 |
| 2,464,052 | 3/1949 | Numrich | 219/38 |
| 2,593,459 | 4/1952 | Johnson | 219/39 |
| 2,710,909 | 6/1955 | Logan et al. | 219/46 |
| 2,719,907 | 10/1955 | Combs | 219/46 |
| 2,889,439 | 6/1959 | Musgrave | 219/19 |
| 2,938,992 | 5/1960 | Crump | 219/46 |

(List continued on next page.)

FOREIGN PATENT DOCUMENTS

| 3512659 | 9/1986 | (DE) . |
|---|---|---|
| 3836387 C1 | 5/1990 | (DE) . |
| 14562 | 9/1913 | (GB) . |
| 1070849 | 6/1967 | (GB) . |
| 1325084 | 8/1973 | (GB) . |
| 1498792 | 1/1978 | (GB) . |
| 2244898 | 12/1991 | (GB) . |
| 53-134245 | 11/1978 | (JP) . |
| 3-129694 | 6/1991 | (JP) . |
| 7-211438 | 11/1995 | (JP) . |

OTHER PUBLICATIONS

"Polymers", Guide to Selecting Engineered Materials, a special issue of Advanced Materials & Processes, Metal Park, OH, ASM International, 1989, pp. 92–93.

"Makroblend Polycarbonate Blend, Tedur Polyphenylene Sulfide", Machine Design: Basics of Design Engineering, Cleveland, OH, Penton Publishing, Inc., Jun. 1991, pp. 820–821, 863, 866–867.

"Flexibility and Cost Savings with Rope Elements", article from Heating Engineers, Inc., 8/98.

Patent Abstracts of Japan, vol. 095, No. 011, Dec. 26, 1995 & JP 07211438A (Micro Jienitsukusu KK) Aug. 11, 1995, abstract.

"At HEI, Engineering is our Middle Name", Heaters Engineering, Inc., Mar. 2, 1995.

European Search Report, Jul. 13, 1998.

(List continued on next page.)

*Primary Examiner*—Teresa Walberg
*Assistant Examiner*—Thor Campbell
(74) *Attorney, Agent, or Firm*—Duane Morris & Heckscher

(57) ABSTRACT

Heating elements, electrical devices and processes for manufacturing these components are provided. The heating elements and electrical components employ a fibrous support layer, such as a non-woven glass mat, which provides structural support to the relatively thin cross-section of the electrical device or resistance wire when a polymeric layer is applied, such as by molding under pressure.

29 Claims, 3 Drawing Sheets

U.S. PATENT DOCUMENTS

| | | | |
|---|---|---|---|
| 3,173,419 | 3/1965 | Dubilier et al. | 128/399 |
| 3,201,738 | 8/1965 | Mitoff | 338/238 |
| 3,211,203 | 10/1965 | Creed et al. | 146/81 |
| 3,238,489 | 3/1966 | Hay | 388/250 |
| 3,268,846 | 8/1966 | Morey | 338/212 |
| 3,296,415 | 1/1967 | Eisler | 219/385 |
| 3,352,999 | 11/1967 | Macoicz et al. | 219/321 |
| 3,374,338 | 3/1968 | Morey | 219/529 |
| 3,496,517 | 2/1970 | Walter | 339/18 |
| 3,564,589 | 2/1971 | Arak | 219/331 |
| 3,573,430 | 4/1971 | Eisler | 219/385 |
| 3,597,591 | 8/1971 | Van Derlip | 219/528 |
| 3,614,386 | 10/1971 | Hepplewhite | 219/312 |
| 3,621,566 | 11/1971 | Welsh | 29/610 |
| 3,657,517 | 4/1972 | Hoyt | 219/535 |
| 3,683,361 | 8/1972 | Salzwedel | 338/322 |
| 3,686,472 | 8/1972 | Harris | 219/213 |
| 3,707,618 | 12/1972 | Zeitlin et al. | 219/336 |
| 3,831,129 | 8/1974 | Frey | 339/19 |
| 3,860,787 | 1/1975 | Strobach | 219/336 |
| 3,878,362 | 4/1975 | Stinger | 219/528 |
| 3,927,300 | 12/1975 | Wada et al. | 219/381 |
| 3,943,328 | 3/1976 | Cunningham | 219/335 |
| 3,952,182 | 4/1976 | Flanders | 219/309 |
| 3,968,348 | 7/1976 | Stanfield | 219/535 |
| 3,976,855 | 8/1976 | Altmann et al. | 219/532 |
| 3,985,928 | 10/1976 | Watanabe et al. | 428/273 |
| 3,987,275 | 10/1976 | Hurko | 219/461 |
| 4,021,642 | 5/1977 | Fields, Jr. | 219/391 |
| 4,046,989 | 9/1977 | Parise et al. | 219/437 |
| 4,058,702 | 11/1977 | Jerles | 219/321 |
| 4,083,355 | 4/1978 | Schwank | 126/39 J |
| 4,094,297 | 6/1978 | Ballentine | 1269/39 J |
| 4,112,410 | 9/1978 | Wrob et al. | 338/243 |
| 4,117,311 | 9/1978 | Sturm | 219/544 |
| 4,152,578 | 5/1979 | Jacobs | 219/336 |
| 4,186,294 | 1/1980 | Bender | 219/527 |
| 4,201,184 | 5/1980 | Scheidler et al. | 126/39 J |
| 4,217,483 | 8/1980 | Vogel et al. | 219/541 |
| 4,224,505 | 9/1980 | Sturm | 219/544 |
| 4,245,149 | 1/1981 | Fairlie | 219/528 |
| 4,272,673 | 6/1981 | Semanaz et al. | 219/544 |
| 4,294,643 | 10/1981 | Tadewald | 156/293 |
| 4,296,311 | 10/1981 | Hagglund et al. | 219/464 |
| 4,313,053 | 1/1982 | Sturm | 219/544 |
| 4,313,777 | 2/1982 | Buckley et al. | 156/272 |
| 4,326,121 | 4/1982 | Welsby et al. | 219/523 |
| 4,334,146 | 6/1982 | Sturm | 219/492 |
| 4,337,182 | 6/1982 | Needham | 524/609 |
| 4,346,287 | 8/1982 | Desloge | 219/541 |
| 4,349,219 | 9/1982 | Sturm | 285/21 |
| 4,354,096 | 10/1982 | Dumas | 219/523 |
| 4,358,552 | 11/1982 | Shinohara et al. | 523/443 |
| 4,375,591 | 3/1983 | Sturm | 219/544 |
| 4,419,567 | 12/1983 | Murphy et al. | 219/336 |
| 4,436,988 | 3/1984 | Blumenkranz | 219/544 |
| 4,482,239 | 11/1984 | Hosono et al. | 355/3 |
| 4,493,985 | 1/1985 | Keller | 219/535 |
| 4,501,951 | 2/1985 | Benin et al. | 219/243 |
| 4,530,521 | 7/1985 | Nyffeler et al. | 285/21 |
| 4,540,479 | 9/1985 | Sakurai et al. | 204/427 |
| 4,606,787 | 8/1986 | Pelligrino | 156/632 |
| 4,633,063 | 12/1986 | Willis | 219/243 |
| 4,641,012 | 2/1987 | Roberts | 219/331 |
| 4,687,905 | 8/1987 | Cunningham et al. | 219/336 |
| 4,703,150 | 10/1987 | Kunnecke et al. | 219/535 |
| 4,707,590 | 11/1987 | Lefebvre | 219/523 |
| 4,725,717 | 2/1988 | Harrison | 219/528 |
| 4,751,528 | 6/1988 | Spehrley, Jr. et al. | 346/140 |
| 4,756,781 | 7/1988 | Etheridge | 156/85 |
| 4,860,434 * | 8/1989 | Louison et al. | 29/611 |
| 4,865,014 | 9/1989 | Nelson | 126/361 |
| 4,913,666 | 4/1990 | Murphy | 439/709 |
| 4,948,948 | 8/1990 | Lesage | 219/329 |
| 4,956,138 | 9/1990 | Barfield | 264/129 |
| 4,970,528 | 11/1990 | Beaufort et al. | 346/25 |
| 4,986,870 | 1/1991 | Frohlich | 156/382 |
| 4,993,401 | 2/1991 | Diekmann et al. | 126/39 |
| 5,013,890 | 5/1991 | Gamble | 392/497 |
| 5,021,805 | 6/1991 | Imaizumi et al. | 346/76 R |
| 5,038,458 | 8/1991 | Wagoner et al. | 29/593 |
| 5,041,846 | 8/1991 | Vincent et al. | 346/25 |
| 5,051,275 | 9/1991 | Wong | 427/58 |
| 5,066,852 | 11/1991 | Willbanks | 219/544 |
| 5,113,480 | 5/1992 | Murphy et al. | 392/501 |
| 5,129,033 | 7/1992 | Ferrara et al. | 392/447 |
| 5,136,143 | 8/1992 | Kutner et al. | 219/544 |
| 5,155,800 | 10/1992 | Rezabek et al. | 382/503 |
| 5,162,634 | 11/1992 | Kusaka | 219/216 |
| 5,184,969 | 2/1993 | Sharpless et al. | 445/24 |
| 5,237,155 | 8/1993 | Hill | 219/544 |
| 5,252,157 | 10/1993 | Inhofe, Jr. | 156/158 |
| 5,255,942 | 10/1993 | Kenworthy | 285/21 |
| 5,287,123 | 2/1994 | Medin et al. | 346/140 R |
| 5,293,446 | 3/1994 | Owens et al. | 392/449 |
| 5,300,760 | 4/1994 | Batiwalla et al. | 219/549 |
| 5,304,778 | 4/1994 | Dasgupta et al. | 219/270 |
| 5,389,184 | 2/1995 | Jacaruso et al. | 156/378 |
| 5,397,873 | 3/1995 | Stoops et al. | 219/450 |
| 5,406,316 | 4/1995 | Schwiebert et al. | 347/18 |
| 5,406,321 * | 4/1995 | Schwiebert et al. | 347/102 |
| 5,408,070 | 4/1995 | Hyllberg | 392/503 |
| 5,453,599 | 9/1995 | Hall, Jr. | 219/544 |
| 5,476,562 | 12/1995 | Inhofe, Jr. | 156/156 |
| 5,477,033 * | 12/1995 | Bergholtz | 219/549 |
| 5,500,667 | 3/1996 | Schwiebert et al. | 347/102 |
| 5,521,357 | 5/1996 | Lock et al. | 219/543 |
| 5,572,290 | 11/1996 | Ueno et al. | 399/329 |
| 5,581,289 | 12/1996 | Firl et al. | 347/104 |
| 5,582,754 | 12/1996 | Smith et al. | 219/438 |
| 5,586,214 | 12/1996 | Eckman | 392/503 |
| 5,619,240 | 4/1997 | Pong et al. | 347/103 |
| 5,625,398 | 4/1997 | Milkovits et al. | 347/104 |
| 5,633,668 | 5/1997 | Schwiebert et al. | 347/102 |
| 5,691,756 | 11/1997 | Rise et al. | 347/102 |
| 5,697,143 | 12/1997 | Barfield | 29/611 |
| 5,708,251 | 1/1998 | Naveh | 219/121.66 |
| 5,779,870 | 7/1998 | Seip | 205/77 |
| 5,780,817 | 7/1998 | Eckman et al. | 219/458 |
| 5,806,177 | 9/1998 | Hosomi et al. | 29/846 |
| 5,822,675 | 10/1998 | Paquet et al. | 428/561 |
| 5,829,171 | 11/1998 | Weber et al. | 36/93 |
| 5,835,679 | 11/1998 | Eckman et al. | 392/503 |
| 5,856,650 | 1/1999 | Rise et al. | 219/216 |
| 5,940,895 | 8/1999 | Wilson et al. | 4/237 |

OTHER PUBLICATIONS

Desloge Engineering Co., Letter to Lou Steinhauser dated Feb. 19, 1997.

Immersion Heaters Oil and Water, p. 11 (19 )v.

Special Purpose Flange Heaters, p. 58 (19 ).

Lakewood Trade Literature entitled "Oil–Filled Radiator Heater" (19 ).

Encon Drawing Part Nos. 02–06–480 & 02–06–481 (19 ).

Encon Drawing No. 500765 (Jun. 10, 1987).

Vulcan Electric Company Trade Literature entitled "Bushing Immersion Heaters", 1983.

Trade Literature "Euro–Burner Solid Disc Conversion Burners" Energy Convertors, Inc., Dallas, PA 1991.

"Polymers," Guide to Selecting Engineering Materials, a special issue of Advanced Materials& Presses, Metals Park, OH, ASM International, 1990, pp. 32–33.

Machine Design, "Basics of Design Engineering" Jun. 1991, pp. 429–432, 551, 882–884.

Machine Design, "Basics of Design Engineering", Jun. 1994, pp. 624–631.

Machine Design, May 18, 2000, 3 pages.

Carvill, Wm. T., "Prepreg Resins", Engineered Materials Handbook, vol. 1, Composites pp. 139–142.

Thermoplastic Polyimide (TPI) Features, RTP Company's 4200 series compounds (4 pages).

World Headquaters, RTP Co, RTP 1300 Series Polyphenylene Sulfide Compounds, 1 page.

World Headquaters, RTP Co, RTP 2100 Series Polyetherimide Compounds, 1 page.

World Headquaters, RTP Co, RTP 3400 Series Liquid Crystal Polymer Compounds, 1 page.

World Headquaters, RTP Co, RTP 4200 Series Thermoplastic Polyimide Compounds, 1 page.

A.M. Wittenberg, "Pin Shorting Contact," Western Electric Technical Digest No. 60, Oct. 1980, p. 25.

International Search Report, Aug. 8, 2000.

* cited by examiner

FIBROUS SUPPORTED POLYMER ENCAPSULATED ELECTRICAL COMPONENT

FIELD OF THE INVENTION

This invention relates to polymer encapsulated electrical components, and more particularly, to fibrous mat reinforced electrical components, such as electrical resistance wires, encapsulated in a polymeric layer.

BACKGROUND OF THE INVENTION

Electrical resistance heating elements are used in many industrial, commercial and residential applications. They have been used to heat electroplating baths in the plating industry and can be found in the baseboard heaters of many homes. A typical construction for an electrical resistance heating element includes a pair of terminal pins brazed to the ends of a Ni—Cr coil, which is then axially disposed through a U-shaped tubular metal sheath. The resistance coil is insulated from the metal sheath by a powdered ceramic material, usually magnesium oxide.

More modern heating elements have been-developed using polymeric insulating materials around a resistance heating wire, such as disclosed in U.S. Pat. No. 5,586,214. These more recent devices employ resinous coatings which are often injection molded over the resistance wire. Since resistance wire is often extremely pliable, injection molding pressures are known to distort the circuit pattern for the wire in unacceptable ways. One solution described in the '214 patent is to provide a polymer inner mold having a series of grooves for receiving the wire and holding it in place while a thermoplastic coating is injection molded over the assembly. This technique has been difficult to implement when thermoplastic materials are loaded with significant amounts of ceramic additives. Such mixtures are viscous and require great pressures of 10,000–25,000 psi to fill the mold properly. Even high mold pressures are sometimes insufficient to fill the details of the mold properly and the greater the mold pressure, the more stress is applied to the circuit pattern.

In still a further method described in U.S. Pat. No. 3,968,348, a resistance heating wire is disposed between a pair of fiberglass mats. A third fiberglass mat carries a heat dissipating metal foil. The three mats are separately impregnated with a thermosetting polyester resin and cured together to form a rigid, fluid impervious laminated structure. While laminating techniques have occasionally produced acceptable products, they often leave air gaps in the cross-section which make uniform heating difficult. Additionally, insufficient bonding to the glass mats or resistance wire can cause delamination, especially due to the difference in thermal expansion rates during heating and cooling cycles.

While such methods for creating resistance heating elements with thermoplastic or thermosetting polymers are known, there remains a need for better manufacturing processes which can further reduce the cost and improve the quality of polymer heaters. There also remains a need for more structural integrity during heating cycles and more effective thermal dissipation of heat from the resistance wire.

SUMMARY OF THE INVENTION

The present invention provides polymer coated electrical components and methods of fabricating such components, and is particularly useful in the manufacturing of electrical resistance heating elements. In one preferred embodiment of the invention, an electrical device is provided having a relatively thin cross-section supported by a fibrous support layer disposed over the device. A polymeric layer is substantially encapsulated around the fibrous support layer and the electrical device.

It is known from experience that the application of polymeric material under pressure to delicate electrical devices can distort or move such devices in a mold. This invention enclosed the devices, such as resistance heating wire, within fibrous support layers to provide structural support to the relatively thin cross-section of the electrical device so that the polymeric layer can be applied to the device in a mold under pressure without distortion or loss of quality control.

The devices and methods of this invention enable relatively thin cross-sections as small as 0.01–0.3 cm to be molded without distortion. The fibrous support layers of this invention help to maintain stability of viscous flows of thermoplastic or thermosetting material and act as a ballast or dampening factor. They also are porous enough to allow the flow of polymeric material to penetrate through their pores so as to thoroughly coat the fibers and the electronic device. The flowing of polymeric materials through the fibrous support layers of this invention help to "wet" the fibers of these support layers to avoid a fracture initiation site along the boundary between the support layers and polymer, which has been known to cause part failure, especially when heated.

The use of polymeric preforms in the molding techniques of this invention also helps to distribute polymeric material over most of the mold surface. The use of preforms and compression molding together, when compared to older injection molding techniques, distributes the molding forces more uniformly along the surface of the fibrous support layer to minimize movement of the electronic device during molding, and assist in the creation of a unified hermetic structure. Additionally, when thermosetting polymers are used, the use of the preform and fibrous support layers of this invention permits a lower compressive force to be used to liquefy thermosetting resins to permit them to flow properly. The preferred glass mats of this invention also improve the flexural modulus of the component by at least 50% over the unreinforced polymer used for encapsulation.

In an additional improvement of this invention, thermally conducting adhesives are used to join the fibrous support layers to the electronic device prior to molding. This permits the device to operate hotter without burning or carbonizing the polymer around the device for achieving higher watt densities, or greater heat dissipation from the device, without failure.

BRIEF DESCRIPTION OF THE DRAWINGS

The accompanying drawings illustrate preferred embodiments of the invention as well as other information pertinent to the disclosure, in which.

DETAILED DESCRIPTION OF THE INVENTION

As used herein, the following terms are defined:

"Substantially Encapsulating" means that at least 85% of the surface area of the designated member is provided with polymeric material, but does not necessarily mean that the coating is hermetic;

"Serpentine Path" means a path which has one or more curves for increasing the amount of electrical resistance material in a given volume of polymeric matrix, for example, for controlling the thermal expansion of the element;

"Melting Temperature" means the point at which a polymeric substance begins to liquefy because of heat;

"Degradation Temperature" means the temperature at which a thermoplastic or thermosetting resin begins to lose its mechanical or physical properties because of thermal damage;

"Melt Bond" means the bond between two members integrally joined, whereby the atoms or molecules of one member mixes with the atoms or molecules of the other.

"Low Volatile Content" means polymeric mixtures, suitable for adhesives, which contain less than 10 wt % volatile components after full set, for example, during use in the final component.

The present invention provides insulated electrical components, including an electrical device having a relatively thin cross-section, a fibrous support system disposed over the electrical device and a polymeric layer substantially encapsulating the fibrous support and the electrical device whereby the fibrous support provides structural support to the relatively thin cross-section of the electrical device when the polymeric layer is applied in a mold under pressure.

The electrical components and heating elements of this invention are designed to operate at power ratings of as low as 5 watts and as great as 10,000 watts with watt densities of 5 watts/inch$^2$ to about 25 watts/inch$^2$. For example, heating elements can be produced for heating paper in an ink jet printer at watt densities of only about 5–8 watts/inch$^2$ using a polymeric layer of polyphenylene sulfide, epoxy or silicone without thermally conductive additives. On the other hand, immersion heaters for heating hot water can be produced with watt densities of about 20–25 watts/inch$^2$ by using an epoxy resin loaded with about 50 weight percent $Al_2O_3$ or MgO ceramic powder with about 5–10 weight percent glass fiber reinforcement.

Although the invention contemplates using glass mat layers adhered to electrical resistance heating wire, teachings are also provided for encapsulating integrated circuit components, such microchips or small circuit boards, power sources, transformers or magnetic devices. Such devices can optionally include thermostat or thermistor controls for regulating current through the device upon reaching a preselected temperature limit.

Heating Element Construction

Figure 1:
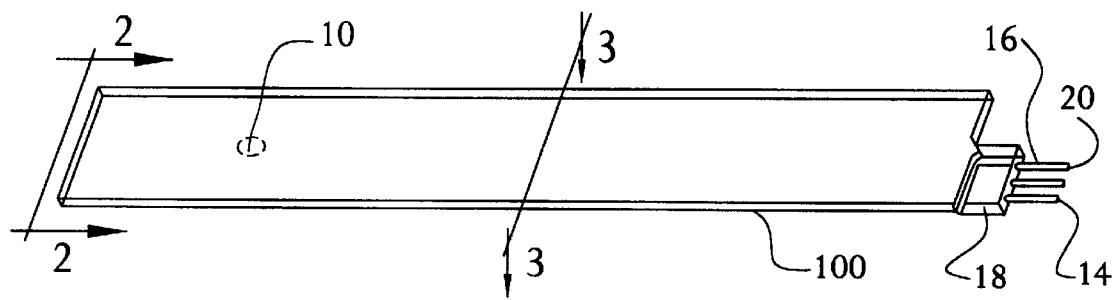
FIG. 1: is a front perspective view of a insulated electronic electrical component of this invention.

In a first embodiment of the invention, shown in FIG. 1, a heating element 100 is provided having an end cap portion 18, a pair of terminal electrical conductors 16 and 14 and a temperature control device 10, such as a thermistor or thermocouple, for regulating the current through the element 100 to protect against overheating.

Figure 2:
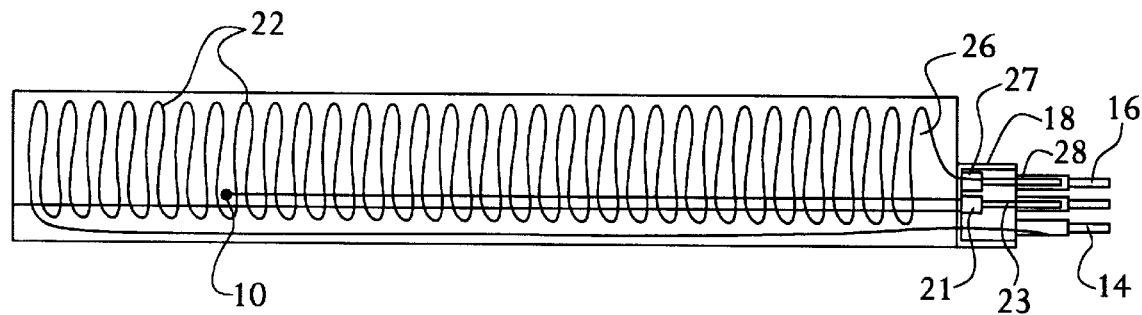
FIG. 2: is a top, cross-sectional view of the electrical component of FIG. 1, taken through line 2—2.

The preferred circuit 22 of the heating element 100 of this invention is illustrated in the cross-sectional view of FIG. 2. The circuit 22 includes a resistance heating material, which is ideally a resistance heating wire 26 wound into a serpentine path containing about 20–51 windings, or, a resistance heating material, such as a foil or printed circuit, or powdered conducting or semi-conducting metals, polymers, graphite, or carbon. Alternatively, a laser trimmed or photoetched Al or Cu foil could be employed. More preferably the resistance heating wire 26 includes a Ni—Cr alloy, although certain copper, steel, and stainless-steel alloy wires could be suitable. Whatever material is selected, it should be electrically conductive, and heat resistant. The resistance heating wire is preferably terminated with a grommets 21 and 27, and cold pins 23 and 28, or alternatively a conductor of another, or further construction, such as flat electrical conductors 16 and 14, for connection to a power source.

Figure 3:
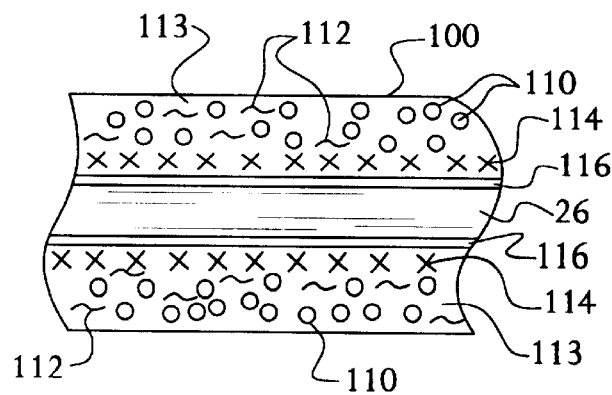
FIG. 3: is a right side, cross-sectional view of the electrical component of FIG. 1, taken through line 3—3, and illustrating the component parts in diagrammatic illustration.

With reference to FIG. 3, there is shown in magnified cross section, a preferred detailed construction of a heating element 100 of this invention. The element 100 of this embodiment includes the polymer layer 113 or matrix, which is preferably of a high-temperature variety including a melting or degradation temperature of greater than 93° C. (200° F.). High temperature polymers known to resist deformation and melting at operating temperatures of about 75–85° C. are particularly useful for this purpose. Both thermoplastics and thermosetting polymers can be used. Preferred thermoplastic materials include, for example, for higher temperature applications: fluorocarbons, polyarylsulphones, polyimides, and polyetheretherkeytones, polyphenylene sulfides, polyether sulphones, and mixtures and co-polymers of these thermoplastics. Preferred thermosetting polymers include epoxies, phenolics, and silicones. Liquid-crystal polymers can also be employed for improving high-temperature use. The most preferred materials for the purposes of the current embodiment of this invention are compression or sheet molding compounds of epoxy reinforced with about 50–60 wt % glass fiber. A variety of commercial epoxies are available which are based on phenol, bisphenol, aromatic diacids, aromatic polyamines and others, for example, Litex 930, available from Quantum Composites, Midland, Mich.

For lower temperature use, less expensive polymers such as polyethylene, polypropylene, or polyvinylchloride could be used.

As stated above, the polymeric layers of this invention preferably also include about 1–60 wt. %, more preferably about 5–10 wt. %, reinforcing fibers, such as glass, carbon, aramid, steel, boron, silicon carbide, polyethylene, polyimide, or graphite fibers. The fibers 112 of FIG. 3 can be disposed throughout the polymeric material prior to molding or forming the element 100, in single filament, multifilament thread, yarn, roving, non-woven or woven fabric.

In addition to reinforcing fibers, this invention contemplates the use of thermally conducting, preferably non-electrically conducting, additives 110 shown in FIG. 3. The thermally-conducting additives 110 desirably include about 30–70 wt. % ceramic powder, flake or fiber, such as, for example, $Al_2O_3$, MgO, $ZrO_2$, Boron nitride, silicon nitride, $Y_2O_3$, SiC, $SiO_2$, $TiO_2$, etc., or a thermoplastic or thermosetting polymer which is more thermally conductive than the polymer matrix suggested to be used with the polymer layer 113. For example, small amounts of liquid-crystal polymer or polyphenylene sulfide particles can be added to a less expensive base polymer such as epoxy or polyvinyl chloride, to improve thermal conductivity.

In order to support the preferred resistance heating element 100 of this invention, a fibrous support layer 114 is desirably employed to hold it in place while the polymer layer 113 is applied under pressure. The fibrous support layer 114 should allow the polymeric resin of the heating element 100 to flow through its structure so as to encapsulate the preferred resistance heating wire 26 or material. However, it should be resilient enough to allow viscous polymer materials, which contain large amounts of glass fibers and ceramic powder, to pass through its course openings without substantially deforming the circuit 22. It will become apparent to one of ordinary skill in the art that the circuit 22 will employ resistance wire having a very fine diameter or cross-sectional thickness, preferably, about 0.01–0.3 cm or less, and that compression molding or injection molding, for example, could cause a dislocation force, pushing the resistance heating wire 26 or other electrical device into the mold wall surface. This could cause unintentional shorts or rejected components.

In the preferred embodiment of this invention, the fibrous support layers 114 comprise resilient nonconducting fibers, such as those made from glass, boron, rayon, Kevlar aramid, or other polymers, for example, fibers made from the same polymer as the matrix of the polymer layer 113. More preferably, the supporting layers include a pair of non-woven cut glass mats, such as Dura-Glass glass mat from Johns Manville having an air permeability rating of at least 1000 ft$^3$/min. for thermosetting resins and at least 500 ft$^3$/min. for low viscosity thermoplastic resins. Dura-Glass mats are relatively thin, non-woven, fiberglass mats composed of cut glass filaments oriented in a random pattern, bonded together with a resinous binder, such as modified acrylic.

The fibrous support layers 114 of this invention can be bonded with adhesive 116 to the resistance heating wire 26 or other electrical device. Good examples of adhesives useful for this purpose include 3M 77 and 4550 spray adhesives. More preferably, the adhesive 116 is a low volatile content adhesive such as acrylic, epoxy, silicon, phenolic, or ester-based adhesives, which can be extruded or molded around a resistance heating wire 26, or other electrical device, or applied as a paste between the electrical device and the fibrous support layers 114. Such adhesive substances can be thermally conductive, or include thermally conductive additives, such as $Al_2O_3$, MgO, etc. in amounts of about 30–70% wt. to increase thermal dissipation from the electrical device and permit greater watt densities, such as those greater than 5 watts/in$^2$ without burning or melting the polymer layer 113. Such thermally conductive, low volatile containing adhesives should effectively wet the fibrous support layers and electronic device, helping to join them together. They also should minimize air gaps between the fibrous support layers 114 and the polymer layers 113, to create more homogenous heat dissipation. They also can increase the tensile strength of the element 100 in cross-sectional direction marked by line 3—3 of FIG. 1, by discouraging delamination along the fibrous support layers 114 during heating and cooling cycles.

Integrated Circuit Encapsulation

Figure 4:
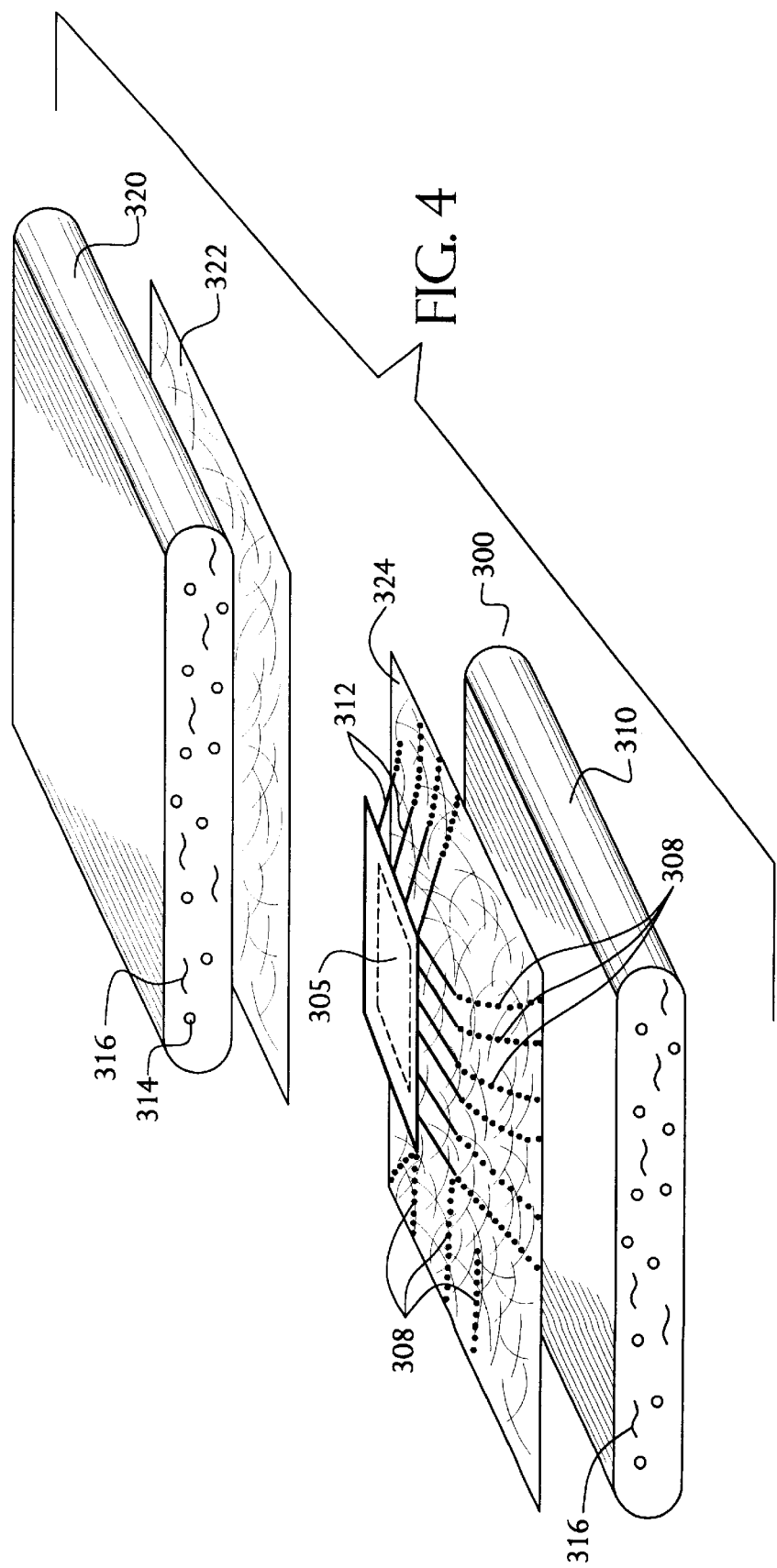
FIG. 4: is an exploded front perspective view of an alternative encapsulated semiconductor chip component of this invention illustrating conductor paths located on the fibrous reinforcement.

With reference to FIG. 4, there is shown an integrated circuit encapsulation 300, including an integrated circuit or "silicon chip" 305 having a plurality of leads 312. The chip 305 of this embodiment can be a microprocessor or memory chip, for example, or a small circuit board having a small cross-sectional dimension, e.g., less than about 0.01–0.3 cm, and designed to be encapsulated in a thermoplastic or thermosetting material. As shown in FIG. 4, the integrated circuit 305 can be disposed on a first fibrous support layer 324, which can have a pattern of conductor paths 308 disposed thereon. Such paths can be copper traces electroplated, photo etched, or applied with a foil and then laser trimmed to produce an electrically conductive path to the edge of the fibrous support layer 324. The support layer 324, together with fibrous support layer 322, helped to provide structural support and a more uniform heat dissipation from the silicon chip 305. The fibrous support layers 324 and 322 can be made of the same materials as the fibrous support layers 114 disclosed previously. Ideally they are made of a non-conductive material, such as a non-woven glass mat. After the fibrous support layers 324 and 322 are joined together with a suitable adhesive substance to entrap the silicon chip 305, they are placed with the silicon chip 305 between a pair of polymeric layer preforms 310 and 320 in a compression molding device. The polymeric layer preforms 310 and 320 can optionally include thermally conductive additives 314 and fibrous reinforcement 316, as discussed previously for the heating element embodiment 100.

Preferred Molding Operation

Figure 5:
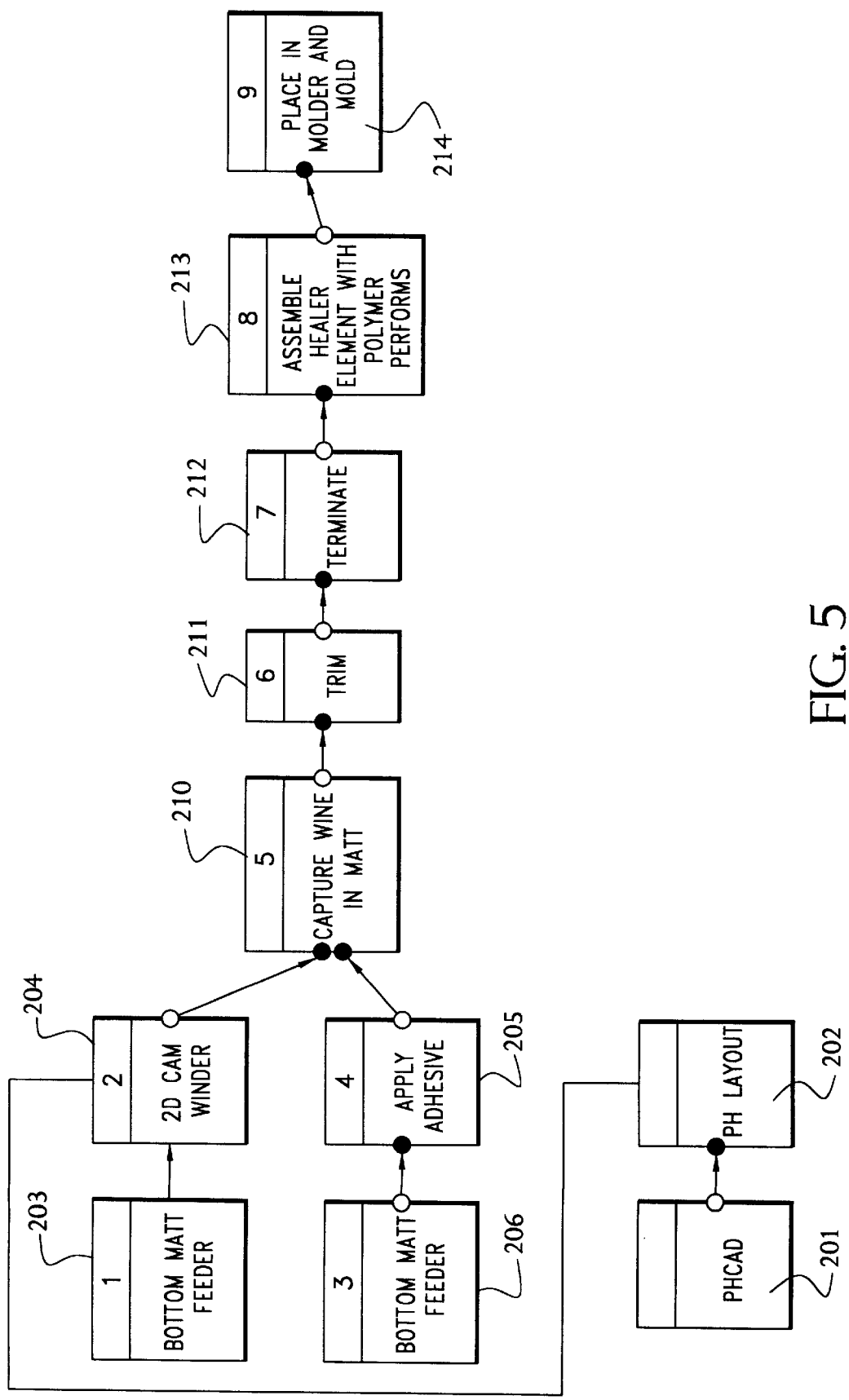
FIG. 5: is a flow diagram of a preferred method of manufacturing the insulated electrical components of this invention.

As shown in FIG. 5, a preferred flow diagram for manufacturing heating elements and other electrical components is provided. The operation begins by preparing a drawing of the device on an appropriate computer program 201. A pin layout step 202 is provided to locate an electrical resistance wire, for example, in a circuit path. A two dimensional winding operation 204 is then used to dispose the electrical resistance wire along the pin layout over a bottom mat which is fed from a bottom mat feeder 203. Simultaneously with the arrangement of the resistance wire along the pin layout, a top sheet feeder 205 disposes a top fibrous support layer into an adhesive operation 206 where the adhesive is applied to at least the top fibrous support layer. Alternatively, a foil, instead of a resistance wire, can be disposed on the bottom mat and then laser etched to create a circuit path. Or, in a further embodiment, a thermally conductive adhesive can be applied to an electrical resistance wire which is then disposed and adhered between the top and bottom fibrous support layers. Optionally, stitching can be used instead of, or in addition to, adhesive.

The two fibrous support layers 114 are then joined with the wire, foil or device in the capture step 210. The fibrous support lay is then trimmed by a cutter at trim step 211 followed by a termination step 212, in which the ends of the conductive resistance heating wire are terminated by crimping a grommet and cold pin to each end of the wire. Following termination, the element precursor is inserted between a pair of polymer layers or preforms. These polymer preforms can include an optional cavity shape or curvature for receiving the wire or chip, or they can be flat.

The polymer preforms are disposed on both sides of the element precursor and then subject to a preferred compression molding operation.

When epoxy is used as the polymeric resin, the platen temperature is set at about the cure temperature for the resin, or about 350–450° F. The platens are adjusted to a compressive load of about 500–4,000 PSI, which allows the epoxy to flow slowly through the porous glass mat layers and permit the epoxy resin to wet and bond to the glass and electrical resistance wire surfaces. At this point, the resin has a viscous yet fluid nature for flowing through the porous fibrous support layers.

It has been observed that when the polymer preforms are in place in the mold, they tend to distribute the viscous epoxy material uniformly throughout the mold, requiring less force to liquefy. Usually less than 5,000 psi is required to liquefy and permit the resin to flow, which is substantially less than most injection molding operations which require over 10,000 psi generally to fill the mold with a molten polymer.

It has also been observed that the preferred fibrous support layers 114 of this invention, glass mats having an air permeability rating of at least about 1,000 ft$^3$/min., help to maintain the stability of the flow of resinous material and create a ballast or dampening factor as the liquefied epoxy flows through the glass material. This permits the electrical component or resistance wire to substantially hold its circuit path placement and location in the mold during resin infiltration. It also substantially eliminates a fracture initiation site along the glass mat during use, since the resin wets and bonds to the glass fibers and resistance wire and forms a substantially continuous phase through the cross-section of the product.

From the foregoing, it can be realized that this invention provides improved heating elements and other electrical devices which contain fibrous support layers and improved processing features for helping to develop improved properties. These properties include greater wetting of the fibrous reinforcement and more resistance to fracture along the fibrous reinforcement polymer boundary, especially during heating cycles. Conductive polymer materials are also disclosed for improved thermal dissipation from electrical resistance wire or other devices to improve watt density without burning the disclosed polymer coatings. Compression molding techniques are also provided which include improved ballasting techniques for easier molding and fibrous mat reinforcement for increasing the strength of polymer heaters. Although various embodiments have been illustrated, this is for the purpose of describing and not limiting the invention. Various modifications, which will become apparent to one skilled in the art, are within the scope of this invention described in the attached claims.

I claim:

1. An insulated electrical component comprising:
  a. an electrical device having a circuit path portion with a relatively thin cross-section which is susceptible to distortion under molding pressure;
  b. a fibrous glass mat support layer being more resistant to distortion under molding pressure than said circuit path portion, disposed over said electrical device and said circuit path portion; and
  c. a polymeric layer molded substantially around said fibrous support layer, said electrical device and said circuit path portion whereby said fibrous glass mat support layer provides structural support and distortion resistance to said circuit path portion when said polymeric layer is applied in a mold under pressure.

2. The electrical component of claim 1 wherein said electrical device comprises and electrical resistance heating foil, powder, wire or printed circuit disposed in a looped circuit path.

3. The electrical component of claim 2 wherein said fibrous support glass mat layer comprises a pair of glass mat layers adhered to a top and bottom surface of said electrical resistance heating foil, powder, wire, or printed circuit.

4. The electrical component of claim 1 wherein said polymeric layer comprises a polymer having a melting or degradation temperature greater than about 93° C.

5. The electrical component of claim 4 wherein said fibrous support glass mat layer is adhered to said electrical device with a low volatile content, thermally conductive adhesive.

6. The electrical component of claim 1 wherein said electrical device comprises one or more of: an integrated circuit component, an electrical conductor path, a power source or resistance wire.

7. The electrical component of claim 1 wherein said polymeric layer is disposed under a pressure of about 500–4,000 psi through said fibrous support glass mat layer and around said electrical device, without substantially moving or distorting said electrical device relative to said fibrous support glass mat layer.

8. The electrical component of claim 6 wherein said electrical device and said polymeric layer are molded into a unified, hermetic structure.

9. The electrical component of claim 1 wherein said fibrous support glass mat layer comprises a glass mat having cut glass fibers joined together with a resinous adhesive.

10. The electrical component of claim 1 wherein said electrical device comprises an electrical resistance heating wire, said electrical component further comprising a thermostat or thermistor adapted to regulate current through said electrical resistance heating wire upon reaching a preselected temperature limit.

11. A resistance heating element comprising:
  a. an electrical resistance heating wire disposed in a circuit path, said wire having a pair of terminal end portions, said electrical resistance heating wire being susceptible to distortion under molding pressure;
  b. a pair of electrical conductors fixed to said terminal end portions of said wire;
  c. a first glass mat adhered to a top surface of said electrical resistance heating wire;
  d. a second glass mat adhered to a bottom surface of said electrical resistance heating wire, said first and second glass mats being more resistant to distortion by molding pressure than said electrical resistance heating wire; and
  e. a high temperature polymeric layer molded under a pressure of at least 500 psi substantially around said circuit path and said first and second glass mats, whereby said first and second glass mats assist in thermally insulating a portion of said polymeric layer from said electrical resistance heating member and provide structural support to said electrical resistance heating wire during said molding so as to resist distortion of said electrical resistance heating wire under said molding pressure.

12. The resistance heating element of claim 11 having a power rating of about 5–10,000 W.

13. The heating element of claim 12 wherein said polymeric layer comprises a non-electrically conductive, thermally-conductive additive.

14. The heating element of claim 11 wherein said first and second glass mats are adhered to said electrical resistance heating member by a low volatile constituent containing thermally conductive adhesive.

15. The heating element of claim 14 wherein said adhesive comprises a thermally conductive additive.

16. The heating element of claim 11 wherein said polymeric layer comprises an epoxy resin bonded to said first and second glass mats and electrical resistance heating member.

17. The heating element of claim 16 wherein said first and second glass mats are joined to said electrical resistance heating member by a polymeric adhesive containing the same polymer as said polymeric layer.

18. A method of making an insulated, electrical component, comprising: providing an electrical device having a relatively thin cross-section portion which is susceptible to being distorted under molding pressure; adhering said electrical device onto a fibrous glass mat support layer which is less susceptible to being distorted under molding pressure than said relatively this cross-section portion; and molding said fibrous glass mat support layer and said electrical device within a polymer layer under pressure, whereby said fibrous glass mat support layer provides structural support to said relatively thin cross-section portion of said electrical device so as to resist distortion thereof when said polymer layer is applied.

19. The method of claim 18, wherein said molding step comprises compression molding a polymer preform over and through said fibrous glass mat support layer and over said electrical device to form a hermetic coating which is resistant to delamination.

20. The method of claim 18, wherein said fibrous glass mat support layer comprises a non-woven or woven glass mat, having an air permeability rating of at least about 1,000 cubic feet per minute.

21. The method of claim 19, wherein said electrical device comprises a Ni—Cr resistance heating wire, and said polymer layer comprises a thermosetting resin.

22. The method of claim 21, wherein said thermosetting resin comprises an non-electrical conducting, thermally conducting additive.

23. The method of claim 19, wherein said polymer preform is subject to heat or pressure or both to substantially become a liquid or semi-liquid for more effectively wetting the surfaces of said fibrous glass mat support layer and said electrical device during said molding step.

24. The method of claim 18, in which said combination of polymer layer and fibrous glass mat support layer has a flexural modulus at least 50% greater than the flexural modulus of said polymer layer, without said fibrous glass mat support layer.

25. A method of making an insulated heating element, comprising:

providing an electrical resistance heating wire disposed in a looped circuit path, said wire having a relatively thin cross-section which is susceptible to distortion of its circuit path by movement thereof under a molding pressure;

disposing a pair of open pore, fibrous glass mat support layers on a top and bottom surface of said electrical resistance heating wire, said fibrous glass mat support layer being more resistant to distortion than said electrical resistance heating wire under said molding pressure and being joined to said electrical resistance heating wire to form an element precursor;

inserting said element precursor between a pair of polymer layers in a molding device; and compression molding said polymer layers and said element precursor to form a substantially hermetic insulating polymeric layer around said circuit path whereby said pair of open pore, fibrous glass mat support layers provide distortion resistance to said electrical resistance heating wire under said molding pressure.

26. The method of claim 24 further comprising liquefying at least a portion of said polymer layers to permit easier penetration of said polymer through said fibrous glass mat support layers.

27. The method of claim 25, wherein said liquefication step comprises the use of heat or pressure or both.

28. The method of claim 26 wherein said fibrous glass mat support layers help to ballast said element precursor in said molding device during said liquefication step.

29. An insulated electrical component comprising:

a. an electrical device having a thin conductive or semi-conductive portion which is susceptible to distortion under a molding pressure;

b. a support layer joined to said electrical device, said support layer comprising a woven or non-woven, open pore mat which has an air permeability rating of at least about 1,000 cubic feet per minute and a distortion resistance to said molding pressure which is greater than said thin conductive or semi-conductive portion; and c. a molded polymeric layer disposed around said electrical device and said support layer, whereby said support layer provides distortion resistance for said thin conductive or semi-conductive portion when said polymeric layer is applied in a mold under said molding pressure.

* * * * *